(12) United States Patent
Komada

(10) Patent No.: US 7,759,694 B2
(45) Date of Patent: Jul. 20, 2010

(54) NITRIDE SEMICONDUCTOR LIGHT-EMITTING DEVICE

(75) Inventor: Satoshi Komada, Mihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 103 days.

(21) Appl. No.: 11/940,954

(22) Filed: Nov. 15, 2007

(65) Prior Publication Data

US 2008/0116476 A1 May 22, 2008

(30) Foreign Application Priority Data

Nov. 22, 2006 (JP) .............................. 2006-315582

(51) Int. Cl.
*H01L 31/00* (2006.01)

(52) U.S. Cl. ......................... 257/103; 257/14; 257/15; 257/94

(58) Field of Classification Search ................... 257/85, 257/9, 15, E39.011, E29.072, E29.298, 14, 257/103, E33.008, E33.034
See application file for complete search history.

(56) References Cited

U.S. PATENT DOCUMENTS

| | | | | |
|---|---|---|---|---|
| 5,077,593 A * | 12/1991 | Sato et al. | ....................... | 257/21 |
| 5,272,712 A * | 12/1993 | Arimoto et al. | ......... | 372/45.012 |
| 5,352,904 A * | 10/1994 | Wen et al. | ....................... | 257/21 |
| 5,563,423 A * | 10/1996 | Wu et al. | ....................... | 257/21 |
| 5,625,635 A | 4/1997 | Kurtz et al. | | |
| 6,153,894 A * | 11/2000 | Udagawa | ..................... | 257/96 |
| 6,430,202 B1 * | 8/2002 | Van de Walle et al. | ... | 372/45.01 |
| 6,534,783 B1 * | 3/2003 | Wu et al. | ....................... | 257/21 |
| 7,067,838 B1 * | 6/2006 | Sato et al. | ..................... | 257/17 |
| 7,084,421 B2 * | 8/2006 | Koike et al. | ..................... | 257/14 |
| 2002/0167983 A1 * | 11/2002 | Marutani et al. | ............... | 372/46 |
| 2003/0179792 A1 * | 9/2003 | Riechert et al. | ................ | 372/43 |
| 2004/0256611 A1 * | 12/2004 | Kim et al. | ...................... | 257/13 |
| 2005/0045895 A1 * | 3/2005 | Emerson et al. | ............... | 257/96 |
| 2005/0056824 A1 * | 3/2005 | Bergmann et al. | ............ | 257/14 |
| 2005/0156189 A1 * | 7/2005 | Deguchi et al. | ............. | 257/103 |
| 2005/0170542 A1 * | 8/2005 | Matsumura | ................... | 438/31 |
| 2006/0054897 A1 * | 3/2006 | Yu et al. | ........................ | 257/79 |
| 2006/0192195 A1 * | 8/2006 | Lee | ............................... | 257/14 |
| 2006/0249727 A1 * | 11/2006 | Yu et al. | ....................... | 257/14 |
| 2007/0045609 A1 * | 3/2007 | Saxler | .......................... | 257/14 |
| 2007/0057276 A1 * | 3/2007 | Kiyoku et al. | ............... | 257/103 |
| 2007/0086496 A1 * | 4/2007 | Tanaka et al. | ............. | 372/43.01 |
| 2007/0086498 A1 * | 4/2007 | Ono et al. | ................. | 372/43.01 |
| 2008/0093610 A1 * | 4/2008 | Lee | ............................... | 257/94 |
| 2008/0108160 A1 * | 5/2008 | Goto et al. | ..................... | 438/31 |
| 2009/0065762 A1 * | 3/2009 | Lee et al. | ....................... | 257/13 |

FOREIGN PATENT DOCUMENTS

| | | |
|---|---|---|
| CN | 1666350 A | 9/2005 |
| JP | 06-268257 A | 9/1994 |
| JP | 11-330554 A | 11/1999 |
| WO | WO-2004/008552 A2 | 1/2004 |

* cited by examiner

*Primary Examiner*—Leonardo Andújar
*Assistant Examiner*—Teresa M Arroyo
(74) *Attorney, Agent, or Firm*—Morrison & Foerster LLP

(57) ABSTRACT

In a nitride semiconductor light-emitting device having an active layer between an n-type nitride semiconductor layer and a p-type nitride semiconductor layer, the active layer has a multiple quantum well structure including a plurality of $In_xGa_{1-x}N$ ($0<x\leq 1$) quantum well layers and a plurality of $In_yGa_{1-y}N$ ($0\leq y<1$) barrier layers stacked alternately, and at least one of the plurality of barrier layers has a super-lattice structure in which a plurality of barrier sub-layers having mutually different In composition ratios are stacked periodically.

10 Claims, 1 Drawing Sheet

NITRIDE SEMICONDUCTOR LIGHT-EMITTING DEVICE

This nonprovisional application is based on Japanese Patent Application No. 2006-315582 filed with the Japan Patent Office on Nov. 22, 2006, the entire contents of which are hereby incorporated by reference.

BACKGROUND OF THE INVENTION

1. Field of the Invention

The present invention relates to a nitride semiconductor light-emitting device and particularly to improvement of its luminous efficacy.

2. Description of the Background Art

In a nitride semiconductor light-emitting device such as a nitride semiconductor LED (Light Emitting Diode), according to Japanese Patent Laying-Open No. 06-268257, an active layer interposed between an n-type nitride semiconductor layer and a p-type nitride semiconductor layer has a multiple quantum well (MQW) structure in which a quantum well layer of $In_{0.2}Ga_{0.8}N$ and a barrier layer of $In_{0.04}Ga_{0.96}N$ are repeated alternately for 5 periods.

Further, according to Japanese Patent Laying-Open No. 11-330554, in an MQW active layer of a nitride semiconductor light-emitting device, a well layer of $In_{0.4}Ga_{0.6}N$ and a barrier layer of GaN are repeated alternately for 5 periods.

As described above, in the prior art according to Japanese Patent Laying-Open Nos. 06-268257 and 11-330554, each barrier layer is formed of a single layer of GaN or InGaN.

Incidentally, since InN has a smaller energy band gap compared to GaN, a layer having relatively high In concentration can act as a quantum well layer, while a layer having relatively low In concentration can act as a barrier layer. From a viewpoint of improving luminous efficacy by trapping and recombining carriers in the well layer of the MQW active layer, it is preferable that there is larger difference in band gap between the quantum well layer and the barrier layer, and it is also preferable that the thickness of the barrier layer can be increased to some extent.

As a factor of improving the luminous efficacy by enhancing the quality of MQW active layer in the nitride semiconductor light-emitting device, it may be effective to reduce influence of distortion caused at the interface between the well layer and the barrier layer by lattice mismatch between these layers.

When GaN is used for the barrier layer as described in Japanese Patent Laying-Open No. 11-330554, it is difficult to avoid the influence of distortion caused by lattice mismatch between the InGaN well layer and the GaN barrier layer. Particularly, when a well layer having a high In concentration or a barrier layer having a large thickness is desired in an MQW active layer in a nitride semiconductor light-emitting device for emitting blue light or green light, the influence of distortion caused by lattice mismatch becomes more noticeable.

When InGaN is used both for the well layer and the barrier layer as in Japanese Patent Laying-Open No. 06-268257, it is not possible to increase In concentration in the barrier layer that is required to have sufficiently higher band gap compared to the well layer. Specifically, the In concentration must be made different between the well layer and the barrier layer, and thus it is difficult to avoid the influence of distortion caused by lattice mismatch between the well layer and the GaN barrier layer.

SUMMARY OF THE INVENTION

In spite of the difficulty of the problem related to lattice mismatch in the MQW active layer of nitride semiconductor light-emitting device as described above, a main object of the present invention is to provide a nitride semiconductor light-emitting device having improved luminous efficacy, by reducing the influence of distortion caused by lattice mismatch at the interface between the well layer and the barrier layer.

According to an aspect of the present invention, in a nitride semiconductor light-emitting device having an active layer between an n-type nitride semiconductor layer and a p-type nitride semiconductor layer, the active layer has a multiple quantum well structure including a plurality of $In_xGa_{1-x}N$ ($0<x\leq1$) quantum well layers and a plurality of $In_yGa_{1-y}N$ ($0\leq y<1$) barrier layers stacked alternately and then at least one of the barrier layers has a super-lattice barrier structure in which a plurality of barrier sub-layers having mutually different In composition ratios are stacked periodically.

According to another aspect of the present invention, among the plurality of barrier layers, a barrier layer other than the one in contact with the p-type nitride semiconductor layer has the super-lattice barrier structure. Preferably, the well layer has an In composition ratio larger than that of any of the barrier sub-layers included in the barrier layer. Further, in the barrier layer, it is preferable that the barrier sub-layer having relatively smaller In composition ratio has larger thickness compared to the one having relatively larger In composition ratio.

According to a still further aspect of the present invention, the n-type nitride semiconductor layer includes an n-side super-lattice layer in contact with the active layer; and the n-side super-lattice layer includes n-side super-lattice sub-layers of $In_{z1}Ga_{1-z1}N$ ($0<z1<1$) and of $In_{z2}Ga_{1-z2}N$ ($0\leq z2<1$) stacked alternately.

Preferably, the well layer has an In composition ratio larger than that of any of the n-side super-lattice sub-layers included in the n-side super-lattice layer. Further, in the n-side super-lattice layer, it is preferable that the n-side super-lattice sub-layer having relatively smaller In composition ratio has larger thickness compared to the one having relatively larger In composition ratio.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
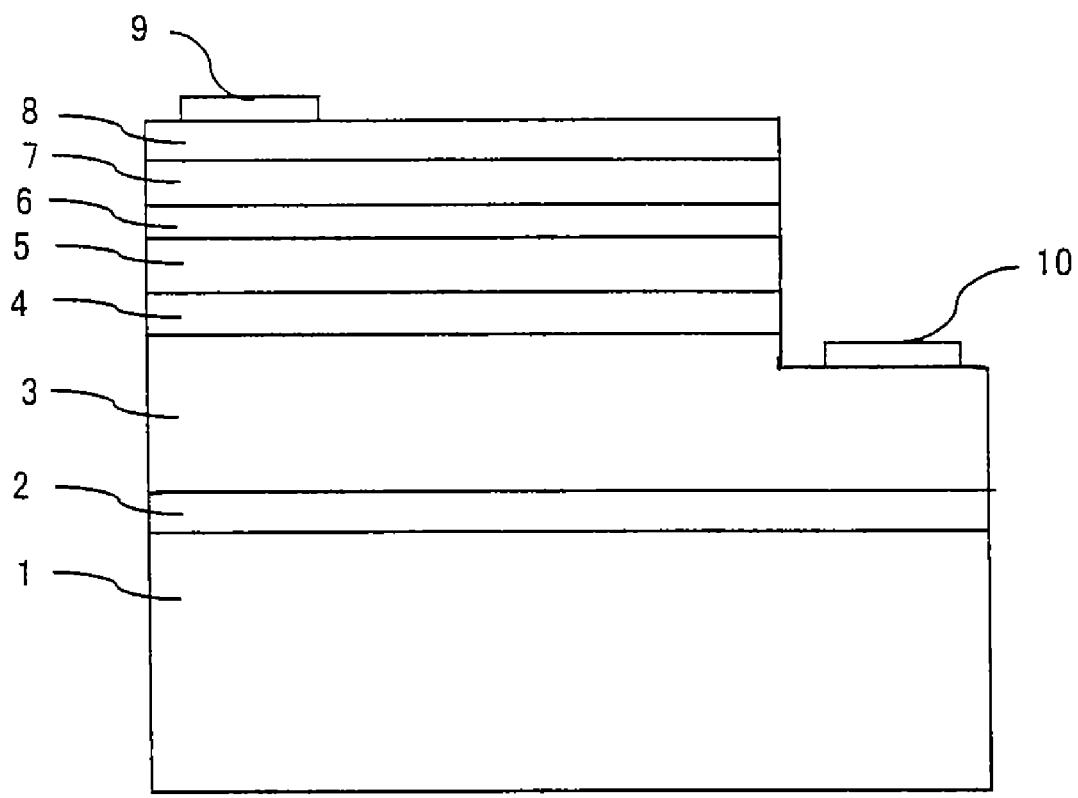
FIG. 1 is a schematic cross-section showing a stacked-layer structure of an LED device according to an embodiment of the present invention.

In the following, a nitride semiconductor light-emitting device according to an embodiment of the present invention will be described in detail, together with some comparative examples.

Embodiment

FIG. 1 is a schematic cross-section illustrating a stacked-layer structure of an LED device according to an Embodiment of the present invention. Needless to say, the present invention is not limited to this Embodiment.

The LED device of FIG. 1 includes a GaN buffer layer 2, an n-type GaN contact layer 3, an n-side super-lattice layer 4, an active layer 5, a p-type AlGaN clad layer 6, and a p-type contact layer 7 stacked successively on a sapphire substrate 1.

P-type contact layer 7 is covered with a p-side transparent electrode 8, on a partial area of which a p-side pad electrode 9 is formed. Further, an n-side pad electrode 10 is formed on a partially exposed area of n-type contact layer 3.

The LED device of FIG. 1 according to the Embodiment of the present invention as described above can be fabricated through the following process.

(Substrate Preprocessing)

First, a sapphire (C-plane) substrate 1 is set in a reaction chamber of an MOCVD (Metal Organic Chemical Vapor Deposition) apparatus. The substrate temperature is increased to 1050° C. letting hydrogen flow in the reaction chamber, whereby the substrate is dry-cleaned.

(Buffer Layer 2)

The cleaned substrate is cooled to 510° C. and then GaN buffer layer 2 is grown to about 20 nm thickness on substrate 1, using ammonia and TMG (trimethyl gallium) for a source gas as well as hydrogen for a carrier gas.

(N-Type Contact Layer 3)

After forming GaN buffer layer 2, the substrate temperature is increased to 1050° C. and then n-side GaN contact layer 3 doped with Si at a concentration of $1\times10^{18}/cm^3$ is grown to 6 μm thickness, using ammonia and TMG (trimethyl gallium) for a source gas, hydrogen for a carrier gas, and silane for an impurity gas.

(N-Side Super-Lattice Layer 4)

After forming n-side GaN contact layer 3, the substrate temperature is decreased to 800° C. and then n-side super-lattice layer 4 is formed using ammonia, TMG and TMI (trimethyl indium) for a source gas as well as nitrogen for a carrier gas. At this time, a first kind of n-side super-lattice sub-layer of $In_{0.05}Ga_{0.95}N$ is grown to 2 nm thickness and then a second kind of n-side super-lattice sub-layer of GaN is grown thereon to 15 nm thickness. These first and second kinds of n-side super-lattice sub-layers are grown alternately for 9 periods, thereby forming n-side super-lattice layer 4.

It is natural that the In composition ratio, thickness and the like of n-side super-lattice sub-layers are not limited to those exemplarily shown in this Embodiment. It is preferred, however, that the n-side super-lattice sub-layer having relatively smaller In composition ratio is made thicker compared to the one having relatively larger In composition ratio. The reason for this is that n-side super-lattice layer 4 should desirably have larger band gap compared to active layer 5. More specifically, the n-side super-lattice sub-layer having relatively smaller In composition ratio should preferably have its thickness in the range of 5 to 20 nm, and the one having relatively larger In composition ratio should preferably have its thickness in the range of 1 to 5 nm.

(Active Layer 5)

After formation of n-side super-lattice layer 4, the substrate temperature is decreased to 750° C. and then a quantum well layer of $In_{0.25}Ga_{0.75}N$ is grown to 2.5 nm thickness, using ammonia, TMG and TMI for a source gas as well as nitrogen for a carrier gas.

Thereafter, a first kind of barrier sub-layer of GaN is grown to 5 nm thickness and a second kind of barrier sub-layer of $In_{0.1}Ga_{0.9}N$ is grown thereon to 1.5 nm thickness. The first and second kinds of barrier sub-layers are grown alternately for 3 periods, thereby forming the super-lattice barrier structure having a thickness of 19.5 nm.

Then, the quantum well layers and the barrier layers having the super-lattice barrier structure are grown alternately for 5 periods. Thereafter, one more well layer is grown, and a barrier layer of a single GaN layer is grown to 20 nm thickness, thereby finishing MQW active layer 5.

It is natural that the In composition ratio, thickness and the like of the barrier sub-layers are not limited to those exemplarily shown in this Embodiment. Preferably, however, the barrier sub-layer having relatively smaller In composition ratio should have larger thickness compared to the one having relatively larger In composition ratio. The reason for this is that the barrier layer should have larger band gap than the well layer. Specifically, the barrier sub-layer having relatively smaller In composition ratio should preferably have the thickness in the range of 2 to 10 nm, and the one having relatively larger In composition ratio should preferably have the thickness in the range of 1 to 3 nm.

(P-Type Clad Layer 6)

After formation of active layer 5, the substrate temperature is increased to 950° C. and then a p-type $Al_{0.15}Ga_{0.85}N$ clad layer 6 doped with Mg at a concentration of $5\times10^{19}/cm^3$ is grown to about 30 nm thickness, using ammonia, TMA (trimethyl aluminum) and TMG for a source gas, hydrogen for a carrier gas, and $CP_2Mg$ (cyclopentadienyl magnesium) for an impurity gas.

(P-Type Contact Layer 7)

After formation of p-type clad layer 6, while the substrate temperature is kept at 950° C., a p-type GaN contact layer 7 doped with Mg at a concentration of $1\times10^{20}/cm^3$ is grown to 0.1 μm thickness, using ammonia and TMG for a source gas, hydrogen for a carrier gas, and $Cp_2Mg$ for an impurity gas.

(Annealing)

After formation of p-type contact layer 7, the substrate temperature is lowered to 700° C. and then annealing is performed in order to activate Mg as the p-type impurity, introducing only nitrogen into the reaction chamber.

(Electrode Formation)

Thereafter, the wafer obtained by growing semiconductor layers 2 to 7 on substrate 1 is taken out from the reaction chamber, and a mask (not shown) patterned to a prescribed shape is formed on a surface of p-type contact layer 7. Using the mask, the wafer is etched from the side of p-type contact layer 7 in an RIE (Reactive Ion Etching) apparatus, whereby n-type contact layer 3 is partially exposed as shown in FIG. 1.

After the etching, a transparent electrode 8 including Pd is formed to 7 nm thickness on almost the entire surface of p-type contact layer 7, and a p-side Au pad electrode 9 is formed to 0.5 μm thickness on a prescribed partial area of transparent electrode 8. On the other hand, an n-side pad electrode 10 including Ti and Al is formed on the partially exposed area of n-type contact layer 3 exposed by the etching. An LED device is finished by the formation of these electrodes.

The LED device of this Embodiment obtained in the above-described manner had emission wavelength of 470 nm and emission output of 4.0 mW with forward current of 20 mA, and the amount of shift in emission wavelength was about 2 nm in the forward current range of 0.1 to 20 mA.

Comparative Example 1

An LED device according to Comparative Example 1 differs from the above-described Embodiment of the invention only in that the structure of active layer 5 is altered. The altered active layer 5 of Comparative Example 1 was formed in the following manner.

Specifically, at the substrate temperature of 750° C., a well layer of $In_{0.25}Ga_{0.75}N$ was grown to 2.5 nm thickness, and a barrier layer of a single GaN layer was grown to 15 nm thickness, using ammonia, TMG and/or TMI for a source gas as well as hydrogen for a carrier gas. These well layer and barrier layer were formed alternately for 6 periods, thereby forming the MQW active layer 5 in Comparative Example 1.

The LED device of Comparative Example 1 obtained in this manner had emission wavelength of 465 nm and emission output of 3.0 mW with forward current of 20 mA, and the amount of shift in emission wavelength was about 10 nm in the forward current range of 0.1 to 20 mA.

From comparison between the LED devices of the Embodiment of the invention and Comparative Example 1, it can be seen that the emission output of the LED device of the Embodiment is significantly improved by including the super-lattice structure in the barrier layer of active layer 5. This indicates that in the Embodiment of the invention, the influence of distortion is reduced in active layer 5 and this leads to improved emission efficacy. Further, in the LED device of the Embodiment, as the influence of distortion is reduced in active layer 5, the amount of shift in emission wavelength becomes significantly smaller.

Comparative Example 2

An LED device according to Comparative Example 2 differs from the above-described Embodiment of the invention only in that n-side super-lattice layer 4 was omitted.

The LED device of Comparative Example 2 had emission wavelength of 470 nm and emission output of 4.0 mW with forward current of 20 mA, and the amount of shift in emission wavelength was about 4 nm in the forward current range of 0.1 to 20 mA.

From comparison between the LED devices of the Embodiment of the invention and Comparative Example 2, it can be seen that in the LED device of the Embodiment, the amount of shift in emission wavelength is made smaller by the provision of n-side super-lattice layer 4. This suggests that in the LED device of the Embodiment, n-side super-lattice layer 4 also contributes to reducing the influence of distortion in active layer 5.

As described above, the present invention can provide a nitride semiconductor light-emitting device in which its luminous efficacy is improved and the amount of shift in emission wavelength is made smaller in the range from low to high injection current, by reducing the influence of distortion caused by lattice mismatch at the interface between the well layer and the barrier layer.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A nitride semiconductor light-emitting device having an active layer between an n-type nitride semiconductor layer and a p-type nitride semiconductor layer, wherein
   said active layer comprises a multiple quantum well structure including a plurality of $In_xGa_{1-x}N$ ($0<x\leq1$) quantum well layers and a plurality of $In_yGa_{1-y}N$ ($0\leq y<1$) barrier layers stacked alternately;
   at least one of said plurality of barrier layers comprises a super-lattice barrier structure in which a plurality of barrier sub-layers having mutually different In composition ratios are stacked periodically in said one of said plurality of barrier layers; and
   a barrier layer of said plurality of barrier layers that is in contact with said p-type nitride semiconductor layer consists of a single layer.

2. The nitride semiconductor light-emitting device according to claim 1, wherein
   among said plurality of barrier layers, a barrier layer other than the one in contact with said p-type nitride semiconductor layer has said super-lattice barrier structure.

3. The nitride semiconductor light-emitting device according to claim 1, wherein
   the barrier layer having said super-lattice structure includes a first barrier sublayer of $In_{y1}Ga_{1-y1}N$ ($0\leq y1<1$) and a second barrier sub-layer of $In_{y2}Ga_{1-y2}N$ ($y1<y2<1$).

4. The nitride semiconductor light-emitting device according to claim 3, wherein
   at least one of said quantum well layers has an In composition ratio larger than that of any of said barrier sub-layers included in said barrier layer having said super-lattice structure.

5. The nitride semiconductor light-emitting device according to claim 3, wherein
   in said barrier layer having said super-lattice structure, said first barrier sub-layer has a larger thickness compared to a thickness of said second barrier sub-layer.

6. The nitride semiconductor light-emitting device according to claim 5, wherein
   said first barrier sub-layer has a thickness in a range of 2 to 10 nm, and the second barrier sub-layer has a thickness in a range of 1 to 3 nm.

7. The nitride semiconductor light-emitting device according to claim 1, wherein
   said n-type nitride semiconductor layer includes an n-side super-lattice layer in contact with said active layer; and
   the n-side super-lattice layer includes an n-side super-lattice sub-layers of $In_{z1}Ga_{1-z1}N$ ($0<z1<1$) and of $In_{z2}Ga_{1-z2}N$ ($0\leq z2<1$) stacked alternately.

8. The nitride semiconductor light-emitting device according to claim 7, wherein
   at least one of said quantum well layers has an In composition ratio larger than that of any of said n-side super-lattice sub-layers included in said n-side super-lattice layer.

9. The nitride semiconductor light-emitting device according to claim 7, wherein
   in said n-side super-lattice layer, said n-side super-lattice sub-layer having relatively smaller In composition ratio has larger thickness compared to the one having relatively larger In composition ratio.

10. The nitride semiconductor light-emitting device according to claim 7, wherein
    said n-side super-lattice sub-layer having relatively smaller In composition ratio has a thickness in a range of 5 to 20 nm and the one having relatively larger In composition ratio has a thickness in a range of 1 to 5 nm.

* * * * *